US012772606B2

(12) United States Patent
Kawata

(10) Patent No.: US 12,772,606 B2
(45) Date of Patent: Oct. 20, 2026

(54) NITRIDE SEMICONDUCTOR LIGHT-EMITTING ELEMENT

(71) Applicant: NICHIA CORPORATION, Anan (JP)

(72) Inventor: Yoshitaka Kawata, Itano-gun (JP)

(73) Assignee: NICHIA CORPORATION, Anan (JP)

( * ) Notice: Subject to any disclaimer, the term of this patent is extended or adjusted under 35 U.S.C. 154(b) by 387 days.

(21) Appl. No.: 18/604,715

(22) Filed: Mar. 14, 2024

(65) Prior Publication Data

US 2024/0332450 A1 Oct. 3, 2024

(30) Foreign Application Priority Data

Mar. 28, 2023 (JP) ................................ 2023-051721

(51) Int. Cl.
*H10H 20/812* (2025.01)
*H10H 20/825* (2025.01)

(52) U.S. Cl.
CPC ........ *H10H 20/812* (2025.01); *H10H 20/825* (2025.01)

(58) Field of Classification Search
CPC ... H10H 20/812; H10H 20/825; H10H 20/813
See application file for complete search history.

(56) References Cited

U.S. PATENT DOCUMENTS

2004/0066816 A1 4/2004 Collins et al.
2007/0284564 A1 12/2007 Biwa et al.
2008/0273566 A1 11/2008 Nishinaka et al.
2010/0046205 A1 2/2010 Chu et al.
2010/0288999 A1 11/2010 Kikuchi et al.
2012/0153256 A1 6/2012 Won
2013/0001512 A1 1/2013 Kotani
2013/0001637 A1 1/2013 Fudeta
2013/0146840 A1 6/2013 Han et al.
2013/0168637 A1 7/2013 Teranishi et al.
2013/0270515 A1 10/2013 Fu
2018/0083160 A1 3/2018 Meyer et al.
2021/0202790 A1 7/2021 Hayashi
2023/0126383 A1 4/2023 Hayashi

FOREIGN PATENT DOCUMENTS

CN 106972085 A 7/2017
JP 2004-128502 A 4/2004
JP 2007-110090 A 4/2007
JP 2008-172040 A 7/2008

(Continued)

*Primary Examiner* — Elias Ullah
(74) *Attorney, Agent, or Firm* — Foley & Lardner LLP

(57) ABSTRACT

A nitride semiconductor light-emitting element includes: a first n-side semiconductor layer; a first active layer disposed on the first n-side semiconductor layer and comprising first barrier layers and first well layers alternately arranged; a first p-side semiconductor layer disposed on the first active layer; a second n-side semiconductor layer disposed on and in contact with the first p-side semiconductor layer; a second active layer disposed on the second n-side semiconductor layer; and a second p-side semiconductor layer disposed on the second active layer. The first barrier layer comprises layers including a first layer located closest to the first n-side semiconductor layer, a second layer located closest to the first p-side semiconductor layer, and a plurality of third layers located between the first layer and the second layer.

19 Claims, 7 Drawing Sheets

(56) References Cited

FOREIGN PATENT DOCUMENTS

| | | | |
|---|---|---|---|
| JP | 2008-235606 | A | 10/2008 |
| JP | 2009-099893 | A | 5/2009 |
| JP | 2011-187621 | A | 9/2011 |
| JP | 2013-012684 | A | 1/2013 |
| JP | 2013-138126 | A | 7/2013 |
| JP | 2021-106245 | A | 7/2021 |
| KR | 2012-0072568 | A | 7/2012 |
| KR | 2013-0120591 | A | 11/2013 |

FIG. 5

| | FIRST LIGHT-EMITTING PORTION | | | | Vf (V) 120mA | Po (mW) 120mA |
|---|---|---|---|---|---|---|
| | THIRD LAYER NUMBER OF FIRST GROUP (s) | THIRD LAYER NUMBER OF SECOND GROUP (t) | THIRD LAYER THICKNESS OF FIRST GROUP (nm) | THIRD LAYER THICKNESS OF SECOND GROUP (nm) | | |
| FIRST EXAMPLE | 6 | 1 | 4.0 | 3.6 | 6.82 | 444.4 |
| SECOND EXAMPLE | 4 | 3 | 4.0 | 3.6 | 6.81 | 441.8 |
| THIRD EXAMPLE | 2 | 5 | 4.0 | 3.6 | 6.83 | 443.2 |
| FOURTH EXAMPLE | 4 | 3 | 4.0 | 3.2 | 6.82 | 444.4 |
| FIFTH EXAMPLE | 2 | 5 | 4.0 | 3.2 | 6.78 | 443.2 |
| FIRST COMPARATIVE EXAMPLE | NUMBER OF THIRD LAYERS | :7 | NUMBER OF THIRD LAYERS | :4.0nm | 6.84 | 441.4 |
| SECOND COMPARATIVE EXAMPLE | THICKNESS OF THIRD LAYER | :7 | THICKNESS OF THIRD LAYER | :3.6nm | 6.80 | 441.6 |

FIG. 6

| | FIRST LIGHT-EMITTING PORTION | | | | SECOND LIGHT-EMITTING PORTION | | | | Vf (V) 120mA | Po (mW) 120mA |
|---|---|---|---|---|---|---|---|---|---|---|
| | THIRD LAYER NUMBER OF FIRST GROUP (s) | THIRD LAYER NUMBER OF SECOND GROUP (t) | THIRD LAYER THICKNESS OF FIRST GROUP (nm) | THIRD LAYER THICKNESS OF SECOND GROUP (nm) | SIXTH LAYER NUMBER OF THIRD GROUP (u) | SIXTH LAYER NUMBER OF FOURTH GROUP (v) | SIXTH LAYER THICKNESS OF THIRD GROUP (nm) | SIXTH LAYER THICKNESS OF FOURTH GROUP (nm) | | |
| SIXTH EXAMPLE | 5 | 2 | 4.0 | 3.0 | 5 | 2 | 4.0 | 3.0 | 6.71 | 443.1 |
| THIRD COMPARATIVE EXAMPLE | NUMBER OF THIRD LAYERS | :7 | NUMBER OF THIRD LAYER | :4.0nm | NUMBER OF SIXTH LAYERS | :7 | THICKNESS OF SIXTH LAYER | :4.0nm | 6.72 | 439.8 |

FIG.7

| | THICKNESS OF THIRD LAYERS OF FIRST LIGHT-EMITTING PORTION (nm) | THICKNESS OF SIXTH LAYERS OF SECOND LIGHT-EMITTING PORTION (nm) | Vf (V) 120mA | Po (mW) 120mA |
|---|---|---|---|---|
| FIRST REFERENCE EXAMPLE | 3.5 | 4.0 | 6.70 | 446.4 |
| SECOND REFERENCE EXAMPLE | 3.0 | 4.0 | 6.69 | 443.5 |
| FOURTH COMPARATIVE EXAMPLE | 4.0 | 4.0 | 6.69 | 442.9 |
| FIFTH COMPARATIVE EXAMPLE | 4.0 | 3.5 | 6.70 | 438.6 |
| SIXTH COMPARATIVE EXAMPLE | 4.0 | 3.0 | 6.72 | 419.2 |

NITRIDE SEMICONDUCTOR LIGHT-EMITTING ELEMENT

CROSS-REFERENCE TO RELATED APPLICATIONS

This application is based upon and claims the benefit of priority from the prior Japanese Patent Application No. 2023-051721, filed on Mar. 28, 2023, the entire contents of which are incorporated herein by reference.

BACKGROUND

The present disclosure relates to a nitride semiconductor light-emitting element.

Japanese Patent Publication No. 2004-128502 discloses a light-emitting element including, for example, a first light-emitting portion including a first n-type layer, a first active layer, and a first p-type layer; a tunnel junction disposed on the first light-emitting portion; and a second light-emitting portion disposed on the tunnel junction and including a second n-type layer, a second active layer, and a second p-type laver.

SUMMARY

An object of an embodiment of the present disclosure is to provide a nitride semiconductor light-emitting element in which an increase in a forward voltage is reduced and light emission output is high.

An embodiment of the present disclosure includes: a first n-side semiconductor layer; a first active layer disposed on the first n-side semiconductor layer and including first barrier layers and first well layers alternately arranged; a first p-side semiconductor layer disposed on the first active layer; a second n-side semiconductor layer disposed on the first p-side semiconductor layer and in contact with the first p-side semiconductor layer; a second active layer disposed on the second n-side semiconductor layer; and a second p-side semiconductor layer disposed on the second active layer, wherein the first barrier layer includes a first layer located closest to the first n-side semiconductor layer, a second layer located closest to the first p-side semiconductor layer, and a plurality of third layers located between the first layer and the second layer, the plurality of third layers include a first group including one or more of the third layers and a second group including one or more of the third layers and located closer to the first p-side semiconductor layer side than the first group, and a thickness of the third layer of the second group is less than a thickness of the third layer of the first group.

An embodiment of the present disclosure can provide a nitride semiconductor light-emitting element in which an increase in a forward voltage is reduced and light emission output is high.

BRIEF DESCRIPTION OF THE DRAWINGS

FIG. 5 is a table showing the results of a first demonstration test.

FIG. 6 is a table showing the results of a second demonstration test.

FIG. 7 is a table showing the results of a third demonstration test.

DETAILED DESCRIPTION

Figure 1:
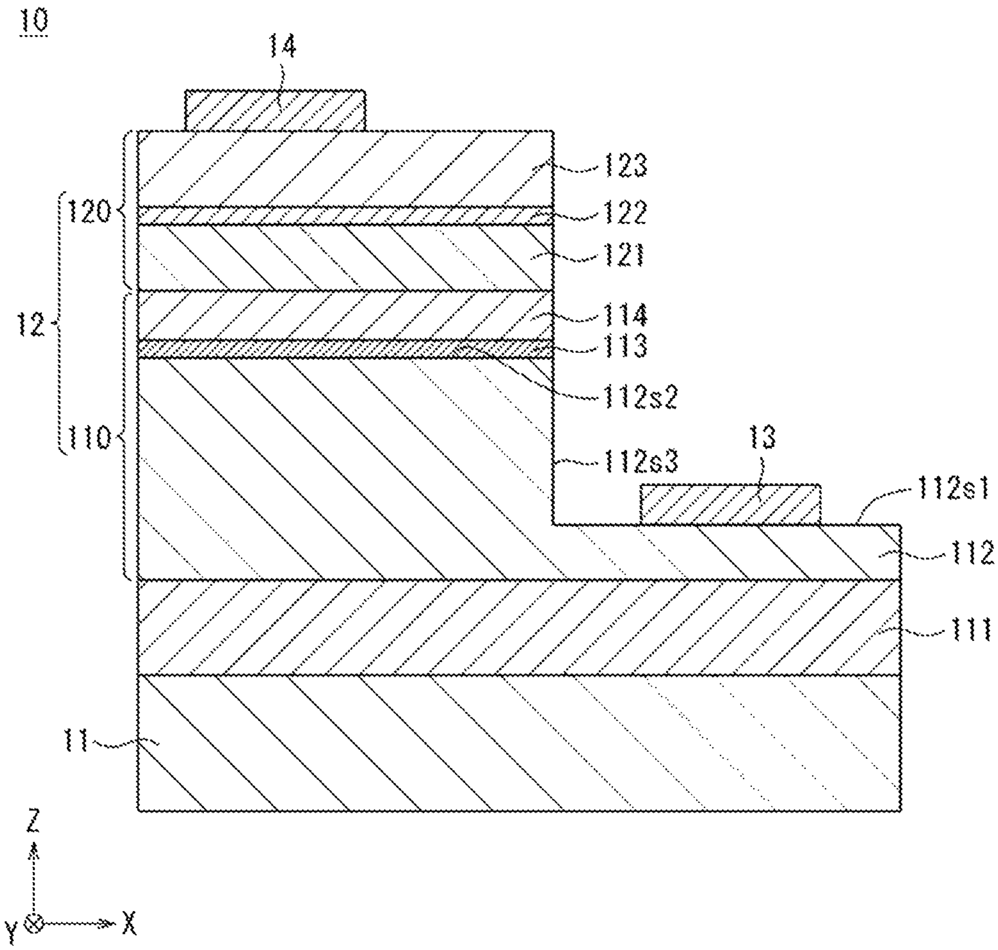
FIG. 1 is a cross-sectional view illustrating a nitride semiconductor light-emitting element according to a first embodiment.

The light-emitting element described in Japanese Patent Publication No. 2004-128502 has the first light-emitting portion below the tunnel junction and the second light-emitting portion above the tunnel junction. Carriers (for example, electrons) supplied from an electrode side of the light-emitting element and carriers (for example, holes) supplied via the tunnel junction are generated in the first light-emitting portion; carriers (for example, holes) generated by the electrode of the light-emitting element and carriers (for example, electrons) supplied via the tunnel junction are generated in the second light-emitting portion. Thus, desired carriers are generated in the first light-emitting portion and the second light-emitting portion, and the first light-emitting portion and the second light-emitting portion emit light.

The inventors of the present application have found a problem that the number of carriers supplied via the tunnel junction is less than the number of carriers generated by the electrode of the light-emitting element, more specifically, the number of carriers (for example, holes) supplied to the active layer of the light-emitting portion below the tunnel junction is small.

The present disclosure has been made as a result of intensive studies based on the above findings, and aims to provide a nitride semiconductor light-emitting element in which an increase in a forward voltage Vf is reduced and light emission output is higher by increasing the number of carriers supplied to a light-emitting portion below a tunnel junction.

Specifically, a nitride semiconductor light-emitting element according to an embodiment the present disclosure includes a first n-side semiconductor layer, a first active layer disposed on the first n-side semiconductor layer and including first barrier layers and first well layers alternately arranged, a first p-side semiconductor layer disposed on the first active layer, a second n-side semiconductor layer disposed on the first p-side semiconductor layer and in contact with the first p-side semiconductor layer, a second active layer disposed on the second n-side semiconductor layer, and a second p-side semiconductor layer disposed on the second active layer. The first barrier layer includes a first layer located closest to the first n-side semiconductor layer, a second layer located closest to the first p-side semiconductor layer, and a plurality of third layers located between the first layer and the second layer, the plurality of third layers include a first group including one or more of the third layers and a second group including one or more of the third layers and located closer to the first p-side semiconductor layer side than the first group, and a thickness of the third layer of the second group is less than a thickness of the third layer of the first group.

In this way, in the first barrier layer of the first active layer, by making the thickness of each third layer of the second group less than the thickness of each third layer of the first group, the number of carriers (holes) supplied to the first active layer from the first p-side semiconductor layer functioning as a tunnel junction can be increased. This can provide a nitride semiconductor light-emitting element having light emission characteristics in which an increase in the forward voltage Vf is reduced and the light emission output is high.

More specific embodiments are described in detail below. The drawings are schematic or conceptual, and the relationships between thicknesses and widths of portions, the proportions of sizes between portions, and the like are not necessarily the same as the actual values thereof. Furthermore, the dimensions and the proportions may be illustrated differently between the drawings, even in a case in which the same portion is illustrated. The same reference signs are attached to equivalent elements throughout the present specification and drawings, and the detailed description thereof may not be given as appropriate.

For clarity of explanation, the arrangement and structure of respective portions will be described using the XYZ orthogonal coordinate system in the following description. The X, Y, and Z-axes are orthogonal to each other. The direction in which the X-axis extends is referred to as the "X-direction," the direction in which the Y-axis extends as the "Y-direction," and the direction in which the Z-axis extends as the "Z-direction." For clarity of explanation, the upper direction is referred to as the Z-direction and the lower direction is referred to as the opposite direction, but these are relative directions and have no relation to the gravitational direction.

First Embodiment of Present Disclosure

A first embodiment of the present disclosure is described with reference to FIGS. 1 and 2. As illustrated in FIG. 1, a nitride semiconductor light-emitting element 10 includes a substrate 11, a semiconductor structure 12, an n-side electrode 13, and a p-side electrode 14. Hereinafter, the nitride semiconductor light-emitting element 10 is also simply referred to as "light-emitting element 10."

Substrate

The substrate 11 has a planar shape. An upper surface and a lower surface of the substrate 11 are approximately parallel to an X-Y plane, for example. The substrate 11 is made of, for example, sapphire ($Al_2O_3$). Alternatively, other materials such as silicon (Si), silicon carbide (SiC), or gallium nitride (GaN) may be used for the substrate 11. The semiconductor structure 12 is disposed on the substrate 11.

Semiconductor Structure

The semiconductor structure 12 is a layered body in which a plurality of semiconductor layers, each made of a nitride semiconductor, are layered. Here, the "nitride semiconductor" represents a semiconductor containing nitrogen and is typically a semiconductor containing all compositions of a chemical formula of $In_xAl_yGa_{1-x-y}N$ ($0 \le x \le 1$, $0 \le y \le 1$, $x+y \le 1$) in which the composition ratios x and y are changed within the respective ranges. In this way, in the present specification, the term "nitride semiconductor light-emitting element" means a light-emitting element in which each semiconductor layer constituting the light-emitting element is made of a nitride semiconductor.

As illustrated in FIG. 1, the semiconductor structure 12 includes a first light-emitting portion 110 and a second light-emitting portion 120 in this order upward from a lower side. The first light-emitting portion 110 includes a first n-side semiconductor layer 112, a first active layer 113, and a first p-side semiconductor layer 114 in this order upward from a lower side. The first light-emitting portion 110 further includes a base layer 111 disposed under the first n-side semiconductor layer 112. The second light-emitting portion 120 includes a second n-side semiconductor layer 121, a second active layer 122, and a second p-side semiconductor layer 123 in this order upward from a lower side. Each portion of the semiconductor structure 12 is described in detail below.

The base layer 111 of the first light-emitting portion 110 is disposed on the substrate 11. The base layer 111 includes, for example, an undoped semiconductor layer. In the present specification, "undoped" means being not intentionally doped with any n-type impurity or p-type impurity. That is, an undoped semiconductor layer is a semiconductor layer formed without supplying a raw material gas including any n-type impurity or p-type impurity. The "n-type impurity" means an impurity serving as a donor. The "p-type impurity" means an impurity serving as an acceptor. When the undoped semiconductor layer is adjacent to a doped layer that is intentionally doped with the n-type impurity and/or the p-type impurity, the undoped semiconductor layer may come to include the n-type impurity and/or the p-type impurity by diffusion or the like from the adjacent layer.

The undoped semiconductor layer in the base layer 111 includes GaN, for example. The first n-side semiconductor layer 112 is disposed on the base layer 111. Alternatively, the base layer may not be disposed in the first light-emitting portion, and the first n-side semiconductor layer may be disposed directly on the substrate.

The first n-side semiconductor layer 112 includes one or more n-type semiconductor layers. The n-type semiconductor layer in the first n-side semiconductor layer 112 includes, for example, GaN doped with silicon (Si) being an n-type impurity. The n-type semiconductor layer in the first n-side semiconductor layer 112 may further include indium (In) or aluminum (Al). The n-type semiconductor layer in the first n-side semiconductor layer 112 may include germanium (Ge) as an n-type impurity.

The first n-side semiconductor layer 112 may have a function of supplying electrons, and further include one or more undoped semiconductor layers. The undoped semiconductor layer in the first n-side semiconductor layer 112 includes GaN, for example.

A first superlattice layer may be disposed on the first n-side semiconductor layer 112. By disposing the first superlattice layer, stress applied to the semiconductor layer formed on the first superlattice layer can be relaxed. The first superlattice layer may have, for example, a layered structure in which semiconductor layers having different lattice constants are alternately layered.

Figure 2A:
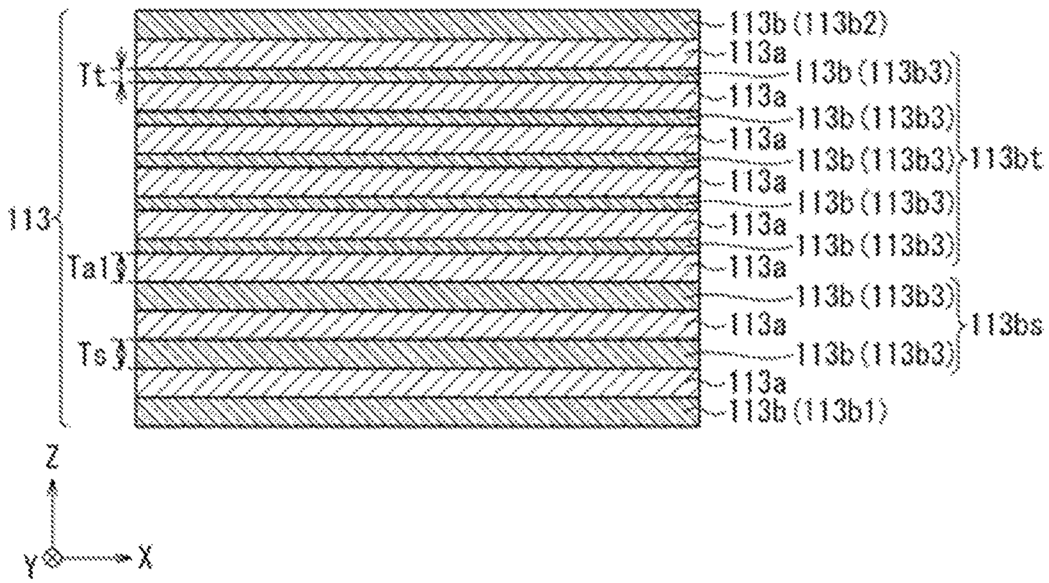
FIG. 2A is an enlarged cross-sectional view illustrating a first active layer in FIG. 1.

The first active layer 113 includes first well layers **113*a* and first barrier layers 113*b* alternately arranged in a layering direction from the first n-side semiconductor layer 112 toward the first p-side semiconductor layer 114, that is, in the Z-direction, as illustrated in FIG. 2A. In the present embodiment, the first active layer 113 includes eight first well layers 113*a* and nine first barrier layers 113*b*. However, the number of first well layers and the number of first barrier layers are not limited to the above. In this way, the first active layer 113 of the present embodiment has a multiple quantum well structure including a plurality of first well layers 113*a***.

Each first well layer **113*a* is, for example, an undoped semiconductor layer including indium gallium nitride (InGaN) containing In, Ga, and N. However, at least one of the plurality of first well layers 113*a* may contain an n-type impurity and/or a p-type impurity. The first well layer 113*a* may further include Al. The first well layer 113*a*** may be made of, for example, aluminum gallium nitride (AlGaN) containing Al, Ga, and N.

A thickness of each first well layer 113a may be in a range from 2 nm to 5 nm, for example. Although the thicknesses of the plurality of first well layers 113a may be substantially the same, the thickness of the first well layer 113a located closest to the first p-side semiconductor layer 114 side may be greater than the thicknesses of the other first well layers 113a (seven first well layers in FIG. 1). As an example, the thickness of the first well layer 113a located closest to the first p-side semiconductor layer 114 side may be made greater by about 10% to 20% than the thicknesses of the first well layers 113a other than the first well layer 113a located closest to the first p-side semiconductor layer 114 side.

The first barrier layer 113b includes a first layer 113b1 located closest to the first n-side semiconductor layer 112 side, a second layer 113b2 located closest to the first p-side semiconductor layer 114 side, and a plurality of third layers 113b3 located between the first layer 113b1 and the second layer 113b2.

The first layer 113b1 has, for example, a layered structure of an undoped semiconductor layer and a semiconductor layer including an n-type impurity. The undoped semiconductor layer in the first layer 113b1 includes GaN, for example. The semiconductor layer including the n-type impurity in the first layer 113b1 includes, for example, InGaN doped with Si being an n-type impurity. The first layer 113b1 has a function of supplying electrons to the first well layer 113a via the first layer 113b1.

A thickness of the first layer 113b1 may be greater than a thickness of the second layer 113b2 and a thickness of the third layer 113b3 to be described below. For example, the thickness of the first layer 113b1 may be in a range from 2 nm to 6 nm, and may be greater than 1 times and equal to or less than 1.5 times the thickness of the second layer 113b2 or the thickness of the third layer 113b3. By setting the thickness of the first layer 113b1 in this way, electrons can be easily supplied from the first layer 113b1 to the first well layer 113a.

The second layer 113b2 is, for example, an undoped semiconductor layer including GaN. However, at least a part of the second layer 113b2 may contain an n-type impurity and/or a p-type impurity. The second layer 113b2 may further include Al. The thickness of the second layer 113b2 is less than the thickness of the first layer 113b1. The thickness of the second layer 113b2 is in a range from 2 nm to 6 nm, for example. The second layer 113b2 has a function of supplying holes to the first well layer 113a via the second layer 113b2.

The third layer 113b3 is, for example, an undoped semiconductor layer including GaN. However, at least one of the plurality of third layers 113b3 may contain an n-type impurity and/or a p-type impurity. The third layer 113b3 may further include Al.

The third layers 113b3 include a first group 113bs including one or more of the third layers 113b3 and a second group 113bt including one or more of the third layers 113b3 and located closer to the first p-side semiconductor layer 114 side than the first group 113bs. The number of third layers 113b3 included in the first group 113bs is s (where s is a natural number). The number of third layers 113b included in the second group 113bt is t (where t is a natural number).

A thickness Tt of each third layer 113b3 of the second group 113bt is less than a thickness Ts of each third layer 113b3 of the first group 113bs. As an example, while the thickness Ts of each third layer 113b3 of the first group 113bs is in a range from 2 nm to 6 nm, the thickness Tt of each third layer 113b3 of the second group 113bt is in a range from 2 nm to 5 nm and is less than the thickness Ts of each third layer 113b3. By making the thickness Tt of each third layer 113b3 of the second group 113bt less than the thickness Ts of each third layer 113b3 of the first group 113bs in this way, the number of carriers (holes) supplied to the first active layer 113 from the first p-side semiconductor layer 114 functioning as a tunnel junction can be increased. Thus, the light emission output of the nitride semiconductor light-emitting element can be further improved and the forward voltage Vf of the nitride semiconductor light-emitting element can be reduced. Note that the thicknesses of the third layers 113b3 of the first group 113bs may be substantially the same, and the thicknesses of the third layers 113b3 of the second group 113bt may be substantially the same.

A relationship between the number of layers in the first group 113bs and the number of layers in the second group 113bt may satisfy $s<t$. In FIG. 2A illustrating an example, an embodiment in which the number of layers in the first group 113bs is 2 and the number of layers in the second group 113bt is 5. By setting such a relationship between the number of layers in the first group 113bs and the number of layers in the second group 113bt and disposing a large number of barrier layers each having a small thickness, a greater number of carriers (holes) can be supplied to the first active layer 113. Thus, the light emission output of the nitride semiconductor light-emitting element can be further increased, and the forward voltage Vf can be further reduced.

The thickness Ts of each third layer 113b3 of the first group 113bs may be greater than a thickness Ta1 of the first well layer 113a. As an example, the thickness Ts of each third layer 113b3 of the first group 113bs may be greater than 1 times and equal to or less than 1.5 times the thickness Ta1 of the first well layer 113a. More specifically, while the thickness Ts of each third layer 113b3 of the first group 113bs is in a range from 2 nm to 6 nm as described above, the thickness Ta1 of the first well layer 113a is in a range from 2 nm to 5 nm and is less than the thickness Ts of the third layer 113b3. By setting the thickness Ts of each third layer 113b3 of the first group 113bs and the thickness Ta1 of the first well layer 113a as described above, the number of carriers (holes) supplied to the first active layer 113 can be further increased, the light emission output of the nitride semiconductor light-emitting element can be further increased, and the forward voltage Vf can be further reduced.

The thickness Tt of each third layer 113b3 of the second group 113bt may be less than the thickness Ta1 of the first well layer 113a. As an example, the thickness Tt of each third layer 113b3 of the second group 113bt may be set to be less than 1 times and equal to or greater than 0.5 times the thickness Ta1 of the first well layer 113a. More specifically, while the thickness Tt of each third layer 113b3 of the second group 113bt is in a range from 2 nm to 5 nm as described above, the thickness Ta1 of the first well layer 113a is in a range from 2 nm to 5 nm and is greater than the thickness Tt of each third layer 113b3. By setting the thickness Tt of each third layer 113b3 of the second group 113bt and the thickness Ta1 of the first well layer 113a as described above, the number of carriers (holes) supplied from the first p-side semiconductor layer 114 to the first active layer 113 can be further increased, the light emission output of the nitride semiconductor light-emitting element can be further increased, and the forward voltage Vf can be further reduced.

As illustrated in FIG. 1, the first p-side semiconductor layer 114 is disposed on the first active layer 113, that is, on the first barrier layer 113*b* located at the uppermost position.

The first p-side semiconductor layer 114 includes, for example, one or more p-type semiconductor layers having a function of supplying holes to the first active layer 113. The p-type semiconductor layer in the first p-side semiconductor layer 114 includes, for example, GaN doped with magnesium (Mg) being a p-type impurity. The p-type semiconductor layer in the first p-side semiconductor layer 114 may further include Al.

The first p-side semiconductor layer 114 may further include one or more undoped semiconductor layers. The undoped semiconductor layer in the first p-side semiconductor layer 114 includes GaN, for example. The undoped semiconductor layer in the first p-side semiconductor layer 114 may further include Al. The first p-side semiconductor layer 114 may further include a p-type semiconductor layer in tunnel junction with the second n-side semiconductor layer 121. The p-type semiconductor layer in tunnel junction with the second n-side semiconductor layer 121 includes, for example, GaN doped with Mg as a p-type impurity. The concentration of the p-type impurity of the p-type semiconductor layer in tunnel junction with the second n-side semiconductor layer 121 is higher than, for example, the concentration of a p-type impurity of a p-type semiconductor layer located below the p-type semiconductor layer in the first p-side semiconductor layer 114. The second n-side semiconductor layer 121 is disposed on the first p-side semiconductor layer 114.

As illustrated in FIG. 1, the second n-side semiconductor layer 121 includes, for example, one or more n-type semiconductor layers having a function of supplying electrons to the second active layer 122. The n-type semiconductor layer in the second n-side semiconductor layer 121 includes, for example, GaN doped with silicon (Si) being an n-type impurity. The n-type semiconductor layer in the second n-side semiconductor layer 121 may further include indium (In), aluminum (Al), or the like. The n-type semiconductor layer in the second n-side semiconductor layer 121 may include germanium (Ge) as an n-type impurity. The second n-side semiconductor layer 121 may further include an n-type semiconductor layer in tunnel junction with the first p-side semiconductor layer 114. The n-type semiconductor layer in tunnel junction with the first p-side semiconductor layer 114 includes, for example, GaN doped with Si as an n-type impurity. The concentration of the n-type impurity of the n-type semiconductor layer in tunnel junction with the first p-side semiconductor layer 114 is higher than, for example, concentration of an n-type impurity of an n-type semiconductor layer located above the n-type semiconductor layer in tunnel junction with the first p-side semiconductor layer 114 in the second n-side semiconductor layer 121.

The second n-side semiconductor layer 121 may have a function of supplying electrons, and further include one or more undoped semiconductor layers. The undoped semiconductor layer in the second n-side semiconductor layer 121 includes GaN, for example.

A second superlattice layer may be disposed on the second n-side semiconductor layer 121. By disposing the second superlattice layer, stress applied to the semiconductor layer formed on the second superlattice layer can be relaxed. The second superlattice layer can use a semiconductor structure having the same layered structure as the first superlattice layer described above.

Figure 2B:
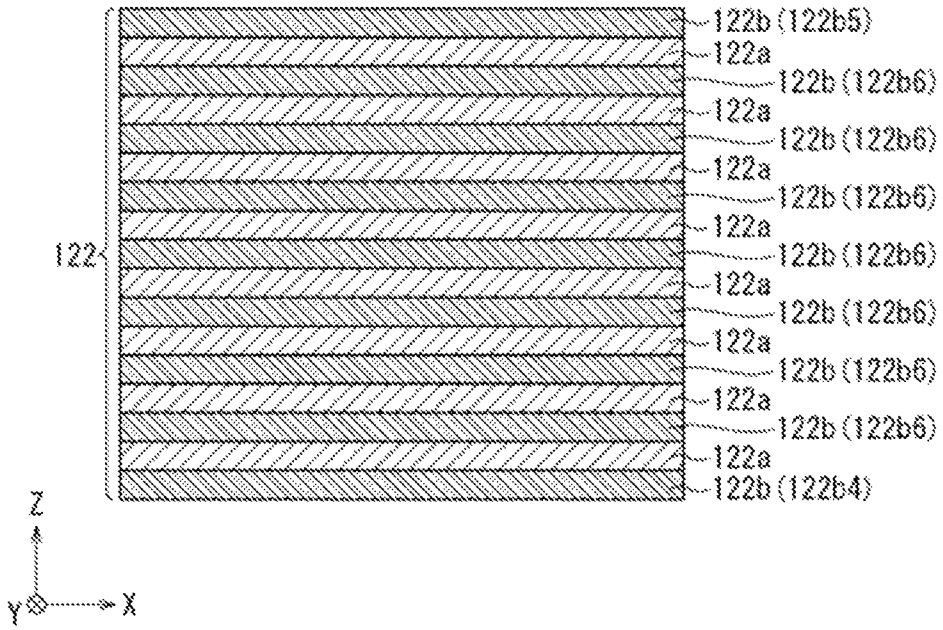
FIG. 2B is an enlarged cross-sectional view illustrating a second active layer in FIG. 1.

The second active layer 122 includes second well layers 122*a* and second barrier layers 122*b* alternately arranged in the layering direction, that is, in the Z-direction, as illustrated in FIG. 2B. In the present embodiment, the second active layer 122 includes eight second well layers 122*a* and nine second barrier layers 122*b*. However, the number of second well layers and the number of second barrier layers are not limited to the above. In this way, the second active layer 122 of the present embodiment has a multiple quantum well structure including a plurality of second well layers 122*a*.

Each second well layer 122*a* is, for example, an undoped semiconductor layer including indium gallium nitride (InGaN). However, at least one of the plurality of second well layers 122*a* may contain an n-type impurity and/or a p-type impurity. The second well layer 122*a* may further include Al. The second well layer 122*a* may be made of, for example, aluminum gallium nitride (AlGaN).

A thickness of each second well layer 122*a* may be in a range from 2 nm to 5 nm, for example. Although the thicknesses of the plurality of second well layers 122*a* may be substantially the same, the thickness of the second well layer 122*a* located closest to the second p-side semiconductor layer 123 side may be greater than the thicknesses of the other second well layers 122*a* (seven second well layers in FIG. 2B). As an example, the thickness of the second well layer 122*a* located closest to the second p-side semiconductor layer 123 side may be made greater by about 10% to 20% than the thicknesses of the second well layers 122*a* other than the second well layer 122*a* located closest to the second p-side semiconductor layer 123 side.

The second barrier layer 122*b* includes a fourth layer 122*b*4 located closest to the second n-side semiconductor layer 121 side, a fifth layer 122*b*5 located closest to the second p-side semiconductor layer 123 side, and a plurality of sixth layers 122*b*6 located between the fourth layer 122*b*4 and the fifth layer 122*b*5.

The fourth layer 122*b*4 has, for example, a layered structure of an undoped semiconductor layer and a semiconductor layer including an n-type impurity. The undoped semiconductor layer in the fourth layer 122*b*4 includes GaN, for example. The semiconductor layer including the n-type impurity in the fourth layer 122*b*4 includes, for example, InGaN doped with Si being an n-type impurity. The fourth layer 122*b*4 has a function of supplying electrons to the second well layer 122*a* via the fourth layer 122*b*4.

A thickness of the fourth layer 122*b*4 may be greater than a thickness of the fifth layer 122*b*5 and a thickness of a sixth layer 122*b*6 to be described below. For example, the thickness of the fourth layer 122*b*4 may be in a range from 2 nm to 6 nm, and may be greater than 1 times and equal to or less than 1.5 times the thickness of the fifth layer 122*b*5 and the thickness of the sixth layer 122*b*6. By setting the thickness of the fourth layer 122*b*4 in this way, electrons can be easily supplied from the fourth layer 122*b*4 to the second well layer 122*a*.

The fifth layer 122*b*5 is, for example, an undoped semiconductor layer including GaN. However, at least a part of the fifth layer 122*b*5 may contain an n-type impurity and/or a p-type impurity. The fifth layer 122*b*5 may further include Al. The thickness of the fifth layer 122*b*5 is less than the thickness of the fourth layer 122*b*4 and is in a range from 2 nm to 6 nm, for example. The fifth layer 122*b*5 has a function of supplying holes to the second well layer 122*a* via the fifth layer 122*b*5.

The sixth layer 122*b*6 is, for example, an undoped semiconductor layer including GaN. However, at least one of the plurality of sixth layers **122*b*6 may contain an n-type impurity and/or a p-type impurity. The sixth layer 122*b*6 may further include Al. The thickness of the sixth layer 122*b*6 may be substantially the same as the thickness of the fifth layer 122*b*5. The thickness of the sixth layer 122*b*6 is in a range from 2 nm to 6 nm, for example. Note that the thicknesses of the plurality of sixth layers 122*b*6** may be substantially the same.

The second p-side semiconductor layer 123 is disposed on the second active layer 122. The second p-side semiconductor layer 123 includes, for example, one or more p-type semiconductor layers. The p-type semiconductor layer in the second p-side semiconductor layer 123 includes, for example, GaN doped with Mg being a p-type impurity. The p-type semiconductor layer in the second p-side semiconductor layer 123 may further include Al.

The second p-side semiconductor layer 123 may have a function of supplying holes to the second active layer 122, and further include one or more undoped semiconductor layers. The undoped semiconductor layer in the second p-side semiconductor layer 123 includes GaN, for example. The undoped semiconductor layer in the second p-side semiconductor layer 123 may further include Al.

As illustrated in FIG. 1, the n-side electrode 13 is disposed on a first surface **112*s*1 of the first n-side semiconductor layer 112. The n-side electrode 13 is electrically connected to the first n-side semiconductor layer 112. The p-side electrode 14 is disposed on the second p-side semiconductor layer 123. The p-side electrode 14 is electrically connected to the second p-side semiconductor layer 123. The first active layer 113 and the second active layer 122 emit light by applying the forward voltage Vf across the n-side electrode 13 and the p-side electrode 14**.

The light emitted by the first active layer 113 and the second active layer 122 is, for example, ultraviolet light or visible light. A light emission peak wavelength of the first active layer 113 can be made equal to a light emission peak wavelength of the second active layer 122. For example, the first active layer 113 and the second active layer 122 may emit blue light. The light emission peak wavelength of the first active layer 113 may be different from the light emission peak wavelength of the second active layer 122. For example, the first active layer 113 may emit blue light, and the second active layer 122 may emit green light. A light emission peak wavelength of blue light is in a range from 430 nm to 490 nm, for example. A light emission peak wavelength of green light is in a range from 500 nm to 540 nm.

When the forward voltage Vf is applied across the n-side electrode 13 and the p-side electrode 14, that is, when a positive potential is applied to the p-side electrode 14 and a potential lower than the potential applied to the p-side electrode 14 is applied to the n-side electrode 13, a reverse bias is applied across the second n-side semiconductor layer 121 and the first p-side semiconductor layer 114. Therefore, in order to cause an electric current to flow between the second n-side semiconductor layer 121 and the first p-side semiconductor layer 114, a tunnel effect due to the second n-side semiconductor layer being in tunnel junction with the first p-side semiconductor layer 114 is used. Specifically, an electric current flows between the second n-side semiconductor layer 121 and the first p-side semiconductor layer 114 by tunneling electrons present in a valence band of the first p-side semiconductor layer 114 to a conduction band of the second n-side semiconductor layer 121. In other words, when the forward voltage Vf is applied to the nitride semiconductor light-emitting element 10, having an electric current flow between the second n-side semiconductor layer 121 and the first p-side semiconductor layer 114 means that the second n-side semiconductor layer 121 is in tunnel junction with the first p-side semiconductor layer 114.

As described above, according to the nitride semiconductor light-emitting element of the present embodiment, in the first barrier layer **113*b* of the first active layer 113, the thickness of each third layer 113*b*3 of the second group 113*bt* is less than the thickness of each third layer 113*b*3 of the first group 113*bs*, resulting in an increase in the number of carriers (holes) supplied to the first active layer 113 from the first p-side semiconductor layer 114 functioning as a tunnel junction. Consequently, the nitride semiconductor light-emitting element 10** having light emission characteristics of low forward voltage Vf and high light emission output can be obtained.

Second Embodiment of Present Disclosure

A second embodiment of the present disclosure is described with reference to FIG. 3. In the second embodiment, the structure of the sixth layer **122*b*6 of the second active layer 122 is different from the structure of the sixth layer 122*b*6 of the second active layer 122 in the first embodiment described above, and the other structures are basically the same as the structures of the first embodiment described above. While the thickness of a part of the third layer 113*b*3 of the first active layer 113 is reduced in the first embodiment described above, the thickness of a part of the third layer 113*b*3 of the first active layer 113 and the thickness of a part of the sixth layer 122*b*6 of the second active layer 122** are reduced in the second embodiment. A structure of the second embodiment different from the structure of the first embodiment described above is described below.

The sixth layer **122*b*6 is, for example, an undoped semiconductor layer including GaN. However, at least one of the plurality of sixth layers 122*b*6 may contain an n-type impurity and/or a p-type impurity. The sixth layer 122*b*6** may further include Al.

The sixth layers **122*b*6 include a third group 122*bu* including one or more of the sixth layers 122*b*6 and a fourth group 122*bv* including one or more of the sixth layers 122*b*6 and located closer to the second p-side semiconductor layer 123 side than the third group 122*bu*. The number of sixth layers 122*b*6 included in the third group 122*bu* is u (where u is a natural number). The number of sixth layers 122*b*6 included in the fourth group 122*bv*** is v (where v is a natural number).

A thickness Tv of each sixth layer **122*b*6 of the fourth group 122*bv* is less than a thickness Tu of each sixth layer 122*b*6 of the third group 122*bu*. As an example, while the thickness Tu of each sixth layer 122*b*6 of the third group 122*bu* is in a range from 2 nm to 6 nm, the thickness Tv of each sixth layer 122*b*6 of the fourth group 122*bv* is in a range from 2 nm to 5 nm and is less than the thickness Tu of each sixth layer 122*b*6 of the third group 122*bu*. By making the thickness Tv of each sixth layer 122*b*6 of the fourth group 122*bv* less than the thickness Tu of each sixth layer 122*b*6 of the third group 122*bu* as described above, the light emission output can be further increased while reducing the forward voltage Vf of the nitride semiconductor light-emitting element. Note that the thicknesses of the sixth layers 122*b*6 of the third group 122*bu* may be substantially the same, and the thicknesses of the sixth layers 122*b*6 of the fourth group 122*bv*** may be substantially the same.

A relationship between the number of layers in the third group 122_bu_ and the number of layers in the fourth group 122_bv_ may satisfy u<v. FIG. 3 illustrates an embodiment in which the third group 122_bu_ has three layers and the fourth group 122_bv_ has four layers. According to such a relationship between the number of layers in the third group 122_bu_ and the number of layers in the fourth group 122_bv_, the light emission output of the nitride semiconductor light-emitting element can be further improved, and the forward voltage Vf can be further reduced.

The thickness Tu of each sixth layer 122_b_6 of the third group 122_bu_ may be greater than a thickness Ta2 of the second well layer 122_a_. As an example, the thickness Tu of each sixth layer 122_b_6 of the third group 122_bu_ may be greater than 1 times and equal to or less than 1.5 times the thickness Ta2 of the second well layer 122_a_. More specifically, while the thickness Tu of each sixth layer 122_b_6 of the third group 122_bu_ is in a range from 2 nm to 6 nm, the thickness Ta2 of the second well layer 122_a_ is in a range from 2 nm to 5 nm and is less than the thickness Tu of the sixth layer 122_b_6 of the third group 122_bu_. By setting the thickness Tu of each sixth layer 122_b_6 of the third group 122_bu_ and the thickness Ta2 of the second well layer 122_a_ as described above, the light emission output of the nitride semiconductor light-emitting element can be further increased and the forward voltage Vf can be further reduced.

The thickness Tv of each sixth layer 122_b_6 of the fourth group 122_bv_ may be less than the thickness Ta2 of the second well layer 122_a_. As an example, the thickness Tv of each sixth layer 122_b_6 of the fourth group 122_bv_ may be set to be less than 1 times and equal to or greater than 0.5 times the thickness Ta2 of the second well layer 122_a_. More specifically, while the thickness Tv of each sixth layer 122_b_6 of the fourth group 122_bv_ is in a range from 2 nm to 5 nm, the thickness Ta2 of the second well layer 122_a_ is in a range from 2 nm to 5 nm and is greater than the thickness Tv of the sixth layer 122_b_6 of the fourth group 122_bv_. By setting the thickness Tv of each sixth layer 122_b_6 of the fourth group 122_bv_ and the thickness Ta2 of the second well layer 122_a_ as described above, the light emission output of the nitride semiconductor light-emitting element can be further increased and the forward voltage Vf can be further reduced.

As an aspect of the nitride semiconductor light-emitting element 10, the number of third layers 113_b_3 may be the same as the number of sixth layers 122_b_6, and t>v may be satisfied in the second group 113_bt_ and the fourth group 122_bv_. FIGS. 2A and 3 illustrate an embodiment in which the number of third layers 113_b_3 is seven and the number of sixth layers 122_b_6 is seven. The second group 113_bt_ includes five third layers 113_b_3 and the fourth group 122_bv_ includes four sixth layers 122_b_6. By setting the number of third layers 113_b_3, the number of sixth layers 122_b_6, the number of layers in the second group 113_bt_, and the number of layers in the fourth group 122_bv_ in this way, the number of carriers (holes) supplied to the first active layer 113 from the first p-side semiconductor layer 114 functioning as a tunnel junction can be more effectively increased. Thus, the light emission output of the nitride semiconductor light-emitting element 10 can be further increased and the forward voltage Vf can be further reduced.

Manufacturing Method of Embodiment of Present Disclosure

Figure 4:
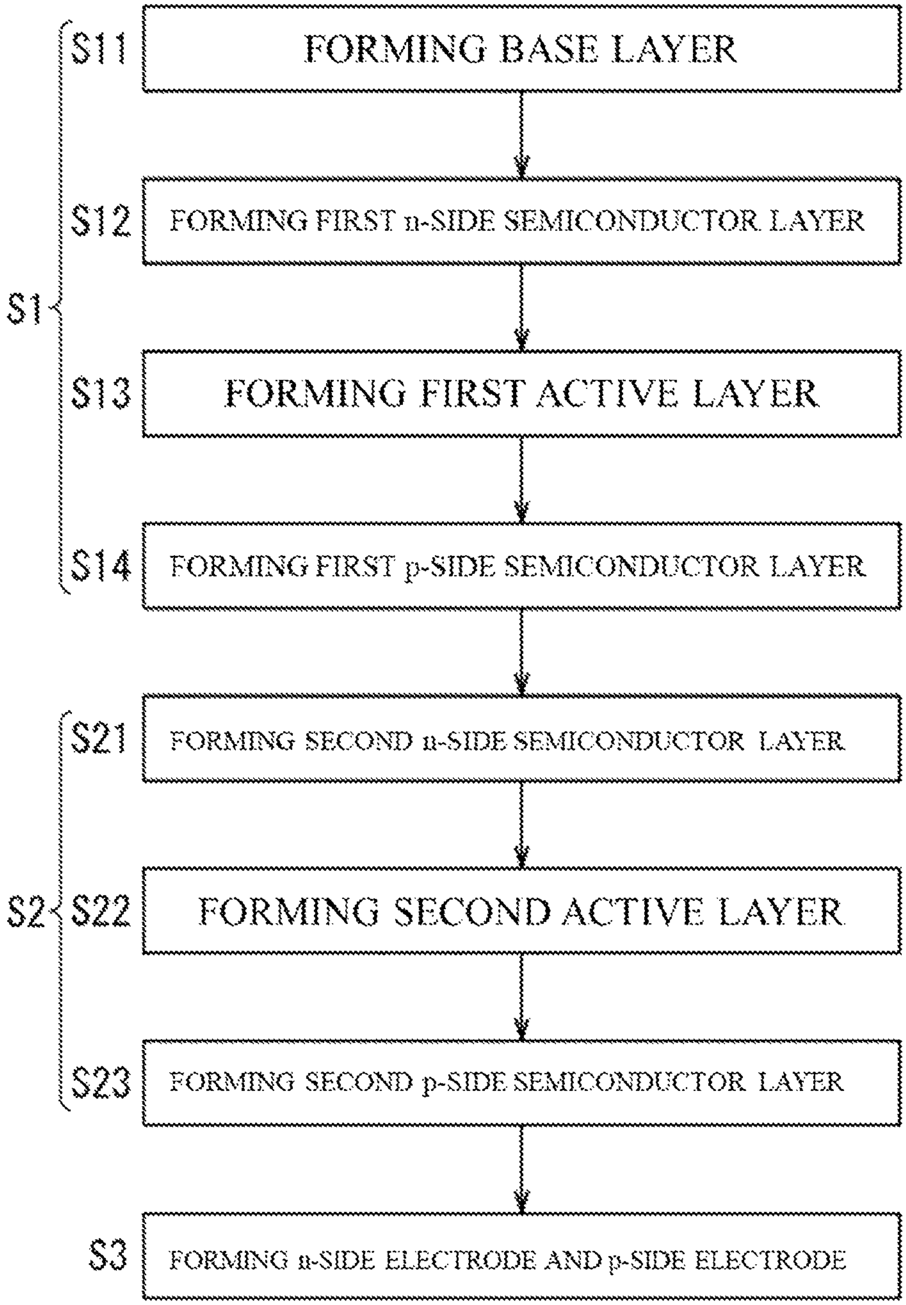
FIG. 4 is a flowchart illustrating a method for manufacturing a nitride semiconductor light-emitting element.

A method for manufacturing the nitride semiconductor light-emitting element 10 is described below. FIG. 4 is a flowchart illustrating a method for manufacturing the nitride semiconductor light-emitting element 10 according to the present embodiment.

As illustrated in FIG. 4, the method for manufacturing the nitride semiconductor light-emitting element 10 includes step S1 of forming the first light-emitting portion 110, step S2 of forming the second light-emitting portion 120, and step S3 of forming the n-side electrode 13 and the p-side electrode 14.

The first light-emitting portion 110 and the second light-emitting portion 120 included in the semiconductor structure 12 are formed, for example, by a metal organic chemical vapor deposition (MOCVD) method in a furnace where pressure and temperature can be adjusted. Specifically, the semiconductor structure 12 is formed on the substrate 11 by supplying a carrier gas and a raw material gas in the furnace.

Examples of the carrier gas that can be used include hydrogen ($H_2$) gas or nitrogen ($N_2$) gas.

The raw material gas is appropriately selected according to the semiconductor layer to be formed. In a case of forming the semiconductor layer including Ga, a raw material gas including Ga such as, for example, trimethylgallium (TMG) gas or triethylgallium (TEG) gas is used. In a case of forming the semiconductor layer including N, a raw material gas including N such as, for example, ammonia ($NH_3$) gas is used. In a case of forming the semiconductor layer including Al, a raw material gas including Al such as, for example, trimethylaluminum (TMA) gas is used. In a case of forming the semiconductor layer including In, a raw material gas including In such as, for example, trimethyl indium (TMI) gas is used. In a case of forming the semiconductor layer including Si, a raw material gas including Si such as, for example, monosilane ($SiH_4$) gas is used. In a case of forming the semiconductor layer including Mg is formed, a raw material gas including Mg such as, for example, biscyclopentadienyl magnesium ($Cp_2Mg$) gas is used. In the following, supplying a raw material gas including a first element and a raw material gas including a second element in the furnace is also simply referred to as "supplying a raw material gas including a first element and a second element." Each process step is described in detail below.

First, step S1 of forming the first light-emitting portion 110 is performed. Step S1 of forming the first light-emitting portion 110 includes step S11 of forming the base layer 111, step S12 of forming the first n-side semiconductor layer 112, step S13 of forming the first active layer 113, and step S14 of forming the first p-side semiconductor layer 114.

In step S11 of forming the base layer 111, the carrier gas and the raw material gas corresponding to the base layer 111 are supplied in the furnace. Accordingly, the base layer 111 is formed on the substrate 11.

In step S12 of forming the first n-side semiconductor layer 112, the carrier gas and the raw material gas corresponding to the first n-side semiconductor layer 112 are supplied in the furnace. Thus, the first n-side semiconductor layer 112 is formed on the base layer 111.

Step S13 of forming the first active layer 113 includes a step of forming the first well layer 113_a_ and the first barrier layer 113_b_. A carrier gas and a raw material gas including Ga and N are supplied in the furnace. At this time, when a raw material gas including any n-type impurity or p-type impurity is not supplied, the first barrier layer 113_b_ being an undoped GaN layer is formed. Subsequently, a carrier gas and a raw material gas including In, Ga, and N are supplied in the furnace. At this time, when a raw material gas including any n-type impurity or p-type impurity is not supplied, the first well layer 113_a_ being an undoped InGaN layer is formed. In the present embodiment, the formation of the first well layer 113*a* and the formation of the first barrier layer 113*b* are alternately performed a plurality of times. Thus, a layered body including the first well layers 113*a* and the first barrier layers 113*b* alternately arranged in the layering direction, that is, the Z-direction, is formed on the first n-side semiconductor layer 112.

In the present embodiment, as the first barrier layer 113*b*, the first layer 113*b*1 located closest to the first n-side semiconductor layer 112 side, the second layer 113*b*2 located closest to the first p-side semiconductor layer 114 side, and a plurality of third layers 113*b*3 located between the first layer 113*b*1 and the second layer 113*b*2 are formed. The plurality of third layers 113*b*3 include the first group 113*bs* including s third layers 113*b*3 (where s is a natural number and is 2 in FIG. 2A illustrating an example) and the second group 113*bt* including t third layers 113*b*3 (where t is a natural number and is 5 in FIG. 2B illustrating an example) located closer to the first p-side semiconductor layer 114 side than the first group 113*bs*. The processing conditions (for example, a processing time, a gas supply amount, and the like) are adjusted so that the thickness Tt of each third layer 113*b*3 of the second group 113*bt* is less than the thickness Ts of each third layer 113*b*3 of the first group 113*bs*.

The number of layers may be set so that a relationship between the number of layers in the first group 113*bs* including the s third layers 113*b*3 and the number of layers in the second group 113*bt* including the t third layers satisfies $s<t$.

As an aspect of the thickness of each third layer 113*b*3 of the first group 113*bs* and the thickness of each third layer 113*b*3 of the second group, the thickness Ts of each third layer 113*b*3 of the first group 113*bs* may be greater than the thickness Ta1 of the first well layer 113*a*, and the thickness Tt of each third layer 113*b*3 of the second group 113*bt* may be less than the thickness Ta1 of the first well layer 113*a*.

In step S14 of forming the first p-side semiconductor layer 114, the carrier gas and the raw material gas corresponding to the first p-side semiconductor layer 114 are supplied in the furnace. Thus, the first p-side semiconductor layer 114 is formed on the first active layer 113, that is, on the first barrier layer 113*b* located at the uppermost position.

As above, the first light-emitting portion 110 including the base layer 111, the first n-side semiconductor layer 112, the first active layer 113, and the first p-side semiconductor layer 114 is formed on the substrate 11.

Subsequently, step S2 of forming the second light-emitting portion 120 is performed. As illustrated in FIG. 4, step S2 of forming the second light-emitting portion 120 includes step S21 of forming the second n-side semiconductor layer 121, step S22 of forming the second active layer 122, and step S23 of forming the second p-side semiconductor layer 123.

In step S21 of forming the second n-side semiconductor layer 121, the carrier gas and the raw material gas corresponding to the second n-side semiconductor layer 121 are supplied in the furnace. Thus, the second n-side semiconductor layer 121 is formed on the first p-side semiconductor layer 114.

Step S22 of forming the second active layer 122 includes a step of forming the second well layer 122*a* and the second barrier layer 122*b*. A carrier gas and a raw material gas including Ga and N are supplied in the furnace. At this time, when a raw material gas including any n-type impurity or p-type impurity is not supplied, the second barrier layer 122*b* being an undoped GaN layer is formed. Subsequently, a carrier gas and a raw material gas including In, Ga, and N are supplied in the furnace. At this time, when a raw material gas including any n-type impurity or p-type impurity is not supplied, the second well layer 122*a* being an undoped InGaN layer is formed. In the present embodiment, the formation of the second well layer 122*a* and the formation of the second barrier layer 122*b* are alternately performed a plurality of times. Thus, a layered body including the second well layers 122*a* and the second barrier layers 122*b* alternately arranged in the layering direction, that is, the Z-direction, is formed on the second n-side semiconductor layer 121.

In an embodiment, as illustrated in FIG. 2B, as the second barrier layer 122*b*, the fourth layer 122*b*4 located closest to the second n-side semiconductor layer 121 side, the fifth layer 122*b*5 located closest to the second p-side semiconductor layer 123 side, and the plurality of sixth layers 122*b*6 located between the fourth layer 122*b*4 and the fifth layer 122*b*5 may be formed.

Figure 3:
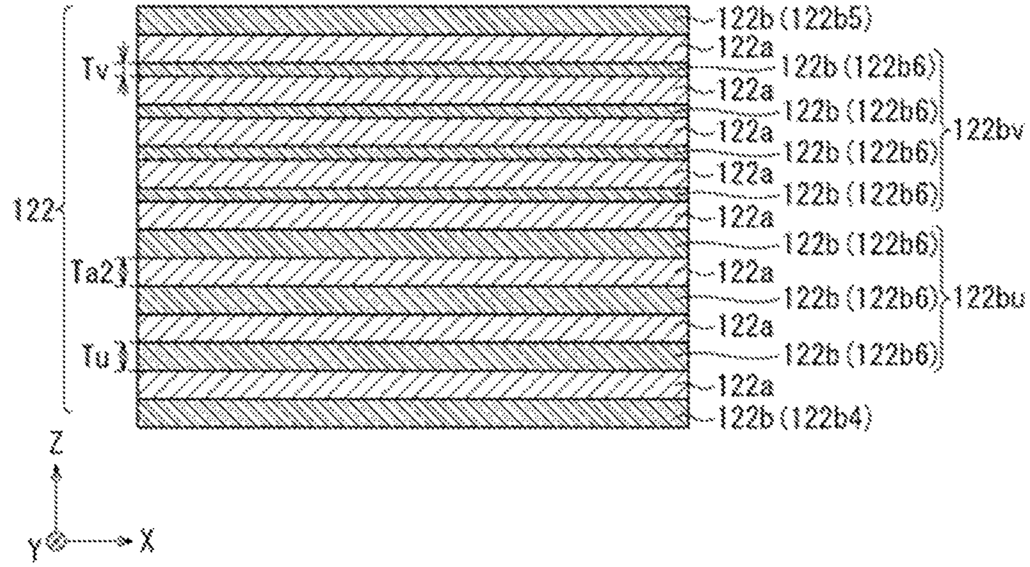
FIG. 3 is an enlarged cross-sectional view illustrating a second active layer of a second embodiment.

In another embodiment, as the second barrier layer, as illustrated in FIG. 3, the plurality of sixth layers 122*b*6 may include a third group 122*bu* including one or more of the sixth layers 122*b*6 and a fourth group 122*bv* including one or more of the sixth layers 122*b*6 and located closer to the second p-side semiconductor layer 123 side than the third group 122*bu*. The number of sixth layers 122*b*6 included in the third group 122*bu* is u (where u is a natural number). The number of sixth layers 122*b*6 included in the fourth group 122*bv* is v (where v is a natural number). FIG. 3 illustrates an embodiment in which the third group 122*bu* includes three sixth layers 122*b*6 and the fourth group 122*bv* includes four sixth layers 122*b*6. The processing conditions (for example, a processing time, a gas supply amount, and the like) may be adjusted so that the thickness Tv of each sixth layer 122*b*6 of the fourth group 122*bv* is less than the thickness Tu of each sixth layer 122*b*6 of the third group 122*bu*.

In step S22 of forming the second active layer 122, the number of layers may be set so that a relationship between the number of layers in the third group 122*bu* including the u sixth layers 122*b*6 and the number of layers in the fourth group 122*bv* including the v sixth layers 122*b*6 satisfies $u<v$.

As an aspect of the thickness Tu of each sixth layer 122*b*6 of the third group 122*bu* and the thickness of each sixth layer 122*b*6 of the fourth group 122*bv*, the thickness Tu of each sixth layer 122*b*6 of the third group 122*bu* may be greater than the thickness Ta2 of the second well layer 122*a* and the thickness Tv of each sixth layer of the fourth group 122*bv* may be less than the thickness Ta2 of the second well layer 122*a*.

As an embodiment, the number of third layers 113*b*3 may be the same as the number of sixth layers 122*b*6, and the number of layers may be set to satisfy $t>v$ in the second group 113*bt* and the fourth group 122*bv*.

In step S23 of forming the second p-side semiconductor layer 123, the carrier gas and the raw material gas corresponding to the second p-side semiconductor layer 123 are supplied in the furnace. Thus, the second p-side semiconductor layer 123 is formed on the second active layer 122, that is, on the second barrier layer 122*b* located at the uppermost position.

As above, the second light-emitting portion 120 including the second n-side semiconductor layer 121, the second active layer 122, and the second p-side semiconductor layer 123 is formed on the first light-emitting portion 110.

Subsequently, step S3 of forming the n-side electrode 13 and the p-side electrode 14 is performed. First, in step S3 of forming the n-side electrode 13 and the p-side electrode 14, as illustrated in FIG. 1, the first surface 112*s*1 and the third surface 112*s*3 of the first n-side semiconductor layer 112 is exposed from the first active layer 113, the first p-side semiconductor layer 114, and the second light-emitting portion 120 by partially removing the semiconductor structure 12. The semiconductor structure 12 can be partially removed by selective etching, for example, using a resist.

Subsequently, the n-side electrode 13 is formed on the exposed first surface 112*s*1. The p-side electrode 14 is further formed on the second p-side semiconductor layer 123. The n-side electrode 13 and the p-side electrode 14 can be formed by sputtering or vapor deposition, for example.

As above, the nitride semiconductor light-emitting element 10 can be obtained. However, the method for manufacturing the nitride semiconductor light-emitting element 10 is not limited to the above method. For example, the method for manufacturing the nitride semiconductor light-emitting element 10 may not include step S11 of forming the base layer 111 and the first n-side semiconductor layer 112 may be directly formed on the substrate 11.

EXAMPLES

Demonstration tests were conducted on the nitride semiconductor light-emitting element of the present disclosure. Specifically, nitride semiconductor light-emitting elements of comparative examples and examples described below were manufactured. Note that in the following first to third demonstration tests, each demonstration test is a demonstration test independently performed. That is, the performance of samples in the demonstration tests can be evaluated by comparing numerical values of the samples. However, numerical values of different demonstration tests are not strictly comparable. For example, results of the first demonstration test are not strictly comparable with results of the second demonstration test or results of the third demonstration test.

First Demonstration Test

Basic structures of the nitride semiconductor light-emitting elements of the first demonstration test are described. The nitride semiconductor light-emitting element 10 used in the first demonstration test includes the first n-side semiconductor layer 112, the first active layer 113 disposed on the first n-side semiconductor layer 112 and including the first barrier layers 113*b* and the first well layers 113*a* alternately arranged, the first p-side semiconductor layer 114 disposed on the first active layer 113, the second n-side semiconductor layer 121 disposed on the first p-side semiconductor layer 114 and in contact with the first p-side semiconductor layer 114, the second active layer 122 disposed on the second n-side semiconductor layer 121, and the second p-side semiconductor layer 123 disposed on the second active layer 122. The first barrier layer 113*b* includes the first layer 113*b*1 located closest to the first n-side semiconductor layer 112 side, the second layer 113*b*2 located closest to the first p-side semiconductor layer 114 side, and seven third layers 113*b*3 located between the first layer 113*b*1 and the second layer 113*b*2.

In the first demonstration test, in the first light-emitting portion 110, the thickness of the first barrier layer 113*b* of the first layer 113*b*1 is 5.1 nm, and the thickness of the first barrier layer 113*b* of the second layer 113*b*2 is 4.0 nm. The thicknesses of the first well layers 113*a* other than the first well layer 113*a* located closest to the first p-side semiconductor layer 114 side among the plurality of first well layers 113*a* are 3.4 nm, respectively. The thickness of the first well layer 113*a* located closest to the first p-side semiconductor layer 114 side is 3.8 nm.

In the first demonstration test, in the second light-emitting portion 120, the thickness of the second barrier layer 122*b* of the fourth layer 122*b*4 is 5.1 nm, the thickness of the second barrier layer 122*b* of the fifth layer 122*b*5 is 4.0 nm, and the thickness of the second barrier layer 122*b* of the sixth layer 122*b*6 is 4.0 nm. The thicknesses of the second well layers 122*a* other than the second well layer 122*a* located closest to the second p-side semiconductor layer 123 side among the plurality of second well layers 122*a* are 3.4 nm, respectively. The thickness of the second well layer 122*a* located closest to the second p-side semiconductor layer 123 side is 3.8 nm. The number of second barrier layers 122*b* is 9, and the number of second well layers 122*a* is 8 as illustrated in FIG. 2B.

In the nitride semiconductor light-emitting elements of first to fifth examples and first and second comparative examples of the first demonstration test, only the structures of the plurality of third layers 113*b*3 among the basic structures of the nitride semiconductor light-emitting elements of the first demonstration test were changed, respectively. First, the structures of the plurality of third layers 113*b*3 of the nitride semiconductor light-emitting elements in the first to fifth examples are described in detail.

First Example

In the nitride semiconductor light-emitting element of the first example, the plurality of third layers 113*b*3 include the first group 113*bs* formed of six layers and the second group 113*bt* formed of one layer and located closer to the first p-side semiconductor layer 114 side than the first group 113*bs*. The thicknesses Ts of the third layers 113*b*3 of the first group 113*bs* are 4.0 nm, respectively, and the thickness Tt of the third layer 113*b*3 of the second group 113*bt* is 3.6 nm (see FIG. 5).

Second Example

In the nitride semiconductor light-emitting element of the second example, the plurality of third layers 113*b*3 include the first group 113*bs* formed of four layers and the second group 113*bt* formed of three layers and located closer to the first p-side semiconductor layer 114 side than the first group 113*bs*. The thicknesses Ts of the third layers 113*b*3 of the first group 113*bs* are 4.0 nm, respectively, and the thicknesses Tt of the third layers 113*b*3 of the second group 113*bt* are 3.6 nm, respectively (see FIG. 5).

Third Example

In the nitride semiconductor light-emitting element of the third example, the plurality of third layers 113*b*3 include the first group 113*bs* formed of two layers and the second group 113*bt* formed of five layers and located closer to the first p-side semiconductor layer 114 side than the first group 113*bs*. The thicknesses Ts of the third layers 113*b*3 of the first group 113*bs* are 4.0 nm, respectively, and the thicknesses Tt of the third layers 113*b*3 of the second group 113*bt* are 3.6 nm, respectively (see FIG. 5).

Fourth Example

In the nitride semiconductor light-emitting element of the fourth example, the plurality of third layers 113*b*3 include the first group **113*bs* formed of four layers and the second group 113*bt* formed of three layers and located closer to the first p-side semiconductor layer 114 side than the first group 113*bs*. The thicknesses Ts of the third layers 113*b*3 of the first group 113*bs* are 4.0 nm, respectively, and the thicknesses Tt of the third layers 113*b*3 of the second group 113*bt* are 3.2 nm, respectively (see FIG. 5**).

Fifth Example

In the nitride semiconductor light-emitting element of the fifth example, the plurality of third layers **113*b*3 include the first group 113*bs* formed of two layers and the second group 113*bt* formed of five layers and located closer to the first p-side semiconductor layer 114 side than the first group 113*bs*. The thicknesses Ts of the third layers 113*b*3 of the first group 113*bs* are 4.0 nm, respectively, and the thicknesses Tt of the third layers 113*b*3 of the second group 113*bt* are 3.2 nm, respectively (see FIG. 5**).

The structures of the plurality of third layers **113*b*3** in the nitride semiconductor light-emitting elements of the first and second comparative examples are described in detail below.

First Comparative Example and Second Comparative Example

In the nitride semiconductor light-emitting element of the first comparative example, the thicknesses of the plurality of third layers **113*b*3 are 4.0 nm, respectively. In the nitride semiconductor light-emitting element of the second comparative example, the thicknesses of the plurality of third layers 113*b*3 are 3.6 nm, respectively (see FIG. 5). In the first comparative example and the second comparative example, the plurality of third layers 113*b*3 do not include the first group and the second group as in the first to fifth examples, and all of the plurality of third layers 113*b*3** have the same thickness.

FIG. 5 illustrates the evaluation results of light emission outputs Po and forward voltages Vf for the nitride semiconductor light-emitting elements of the first to fifth examples and the first and second comparative examples. Note that the values of the light emission outputs Po and the forward voltages Vf are values obtained when an electric current of 120 mA flows through the nitride semiconductor light-emitting elements.

FIG. 5 shows the results that the light emission outputs Po of the nitride semiconductor light-emitting elements of the first to fifth examples are higher than the light emission outputs Po of the nitride semiconductor light-emitting elements of the first and second comparative example. Also, FIG. 5 shows the results that the forward voltages Vf of the nitride semiconductor light-emitting elements of the first to fifth examples are equal to or lower than the forward voltages Vf of the nitride semiconductor light-emitting elements of the first and second comparative example.

Second Demonstration Test

Sixth Example

The basic structures of a nitride semiconductor light-emitting element of a sixth example of a second demonstration test are described. The nitride semiconductor light-emitting element 10 used in the sixth example includes the first n-side semiconductor layer 112, the first active layer 113 disposed on the first n-side semiconductor layer 112 and including the first barrier layers **113*b* and the first well layers 113*a* alternately arranged, the first p-side semiconductor layer 114 disposed on the first active layer 113, the second n-side semiconductor layer 121 disposed on the first p-side semiconductor layer 114 and in contact with the first p-side semiconductor layer 114, the second active layer 122 disposed on the second n-side semiconductor layer 121, and the second p-side semiconductor layer 123 disposed on the second active layer 122. The first barrier layer 113*b* includes the first layer 113*b*1 located closest to the first n-side semiconductor layer 112 side, the second layer 113*b*2 located closest to the first p-side semiconductor layer 114 side, and a plurality of third layers 113*b*3 located between the first layer 113*b*1 and the second layer 113*b*2. The second barrier layer 122*b* includes the fourth layer 122*b*4 located closest to the second n-side semiconductor layer 121 side, the fifth layer 122*b*5 located closest to the second p-side semiconductor layer 123 side, and a plurality of sixth layers 122*b*6 located between the fourth layer 122*b*4 and the fifth layer 122*b*5**.

In the nitride semiconductor light-emitting element of the sixth example, the thickness of the first layer **113*b*1 is 5.1 nm and the thickness of the second layer 113*b*2 is 4.0 nm. The thickness of the first well layer 113*a* located closest to the first p-side semiconductor layer 114 side among the plurality of first well layers 113*a* is 3.4 nm. The thickness of the first well layer 113*a* located closest to the first p-side semiconductor layer 114** side is 3.8 nm.

In the nitride semiconductor light-emitting element of the sixth example, the thickness of the fourth layer **122*b*4 is 5.1 nm and the thickness of the fifth layer 122*b*5 is 4.0 nm. The thickness of the second well layer 122*a* located closest to the second p-side semiconductor layer 123 side among the plurality of second well layers 122*a* is 3.4 nm. The thickness of the second well layer 122*a* located closest to the second p-side semiconductor layer 123** side is 3.8 nm.

The structures of the plurality of third layers **113*b*3 and the structures of the plurality of sixth layers 122*b*6** in the nitride semiconductor light-emitting element of the sixth example are described in detail below.

In the nitride semiconductor light-emitting element of the sixth example, the plurality of third layers **113*b*3 include the first group 113*bs* formed of five layers and the second group 113*bt* formed of two layers and located closer to the first p-side semiconductor layer 114 side than the first group 113*bs*. The thicknesses of the third layers 113*b*3 of the first group 113*bs* are 4.0 nm, respectively, and the thicknesses Tt of the third layers 113*b*3 of the second group 113*bt*** are 3.0 nm, respectively.

In the nitride semiconductor light-emitting element of the sixth example, the plurality of sixth layers **122*b*6 include the third group 122*bu* formed of five layers and the fourth group 122*bv* formed of two layers and located closer to the second p-side semiconductor layer 123 side than the third group 122*bu*. The thicknesses Tu of the sixth layers 122*b*6 of the third group 122*bu* are 4.0 nm, respectively, and the thicknesses Tt of the sixth layers 122*b*6 of the fourth group 122*bv*** are 3.0 nm, respectively.

The difference between the nitride semiconductor light-emitting element of a third comparative example and the nitride semiconductor light-emitting element of the sixth example is described in detail below.

Third Comparative Example

In the nitride semiconductor light-emitting element of the third comparative example, the thicknesses of the plurality of third layers **113*b*3 are 4.0 nm, respectively. That is, in the nitride semiconductor light-emitting element of the third comparative example, the plurality of third layers 113*b*3 do not include the first group and the second group as in the nitride semiconductor light-emitting element of the sixth example, and all of the plurality of third layers 113*b*3 have the same thickness. In the nitride semiconductor light-emitting element of the third comparative example, the plurality of sixth layers 122*b*6 do not include the third group and the fourth group as in the nitride semiconductor light-emitting element of the sixth example, and all of the plurality of sixth layers 122*b*6** have the same thickness.

FIG. 6 illustrates the evaluation results of light emission outputs Po and forward voltages Vf for the nitride semiconductor light-emitting elements of the sixth example and the third comparative example. Note that the values of the light emission outputs Po and the forward voltages Vf are values obtained when an electric current of 120 mA flows through the nitride semiconductor light-emitting elements.

According to FIG. 6, the nitride semiconductor light-emitting element of the sixth example obtained a higher light emission output Po while obtaining a lower forward voltage Vf than the nitride semiconductor light-emitting element of the third comparative example.

Third Demonstration Test Basic structures of the nitride semiconductor light-emitting element of the third demonstration test are described. The nitride semiconductor light-emitting element 10 used in the third demonstration test includes the first n-side semiconductor layer 112, the first active layer 113 disposed on the first n-side semiconductor layer 112 and including the first barrier layers 113*b* and the first well layers 113*a* alternately arranged, the first p-side semiconductor layer 114 disposed on the first active layer 113, the second n-side semiconductor layer 121 disposed on the first p-side semiconductor layer 114 and in contact with the first p-side semiconductor layer 114, the second active layer 122 disposed on the second n-side semiconductor layer 121, and the second p-side semiconductor layer 123 disposed on the second active layer 122. The first barrier layer 113*b* includes the first layer 113*b*1 located closest to the first n-side semiconductor layer 112 side, the second layer 113*b*2 located closest to the first p-side semiconductor layer 114 side, and seven third layers 113*b*3 located between the first layer 113*b*1 and the second layer 113*b*2. The second barrier layer 122*b* includes the fourth layer 122*b*4 located closest to the second n-side semiconductor layer 121 side, the fifth layer 122*b*5 located closest to the second p-side semiconductor layer 123 side, and seven sixth layers 122*b*6 located between the fourth layer 122*b*4 and the fifth layer 122*b*5.

In the nitride semiconductor light-emitting elements of first and second reference examples and fourth to sixth comparative examples of the third demonstration test, the structures of the plurality of third layers 113*b*3 and the structures of the plurality of sixth layers 122*b*6 among the basic structures of the nitride semiconductor light-emitting elements of the third demonstration test were changed, respectively. First, the structure of the first barrier layer 113*b* and the structure of the second barrier layer 122*b* in the nitride semiconductor light-emitting elements in the first and second reference examples are described in detail.

First Reference Example

In the nitride semiconductor light-emitting element of the first reference example, the thickness of the first layer 113*b*1 is 5.1 nm and the thickness of the second layer 113*b*2 is 4.0 nm. The thicknesses of the first well layers 113*a* other than the first well layer 113*a* located closest to the first p-side semiconductor layer 114 side among the plurality of first well layers 113*a* are 3.4 nm, respectively. The thickness of the first well layer 113*a* located closest to the first p-side semiconductor layer 114 side is 3.8 nm. The thickness of each of the seven third layers 113*b*3 is 3.5 nm.

The thickness of the fourth layer 122*b*4 is 5.1 nm, the thickness of the fifth layer 122*b*5 is 4.0 nm, and the thickness of the sixth layer 122*b*6 is 4.0 nm. The thicknesses of the second well layers 122*a* other than the second well layer 122*a* located closest to the second p-side semiconductor layer 123 side among the plurality of second well layers 122*a* are 3.4 nm, respectively. The thickness of the second well layer 122*a* located closest to the second p-side semiconductor layer 123 side is 3.8 nm.

Second Reference Example

In the nitride semiconductor light-emitting element of the second reference example, the thickness of the first layer 113*b*1 is 5.1 nm and the thickness of the second layer 113*b*2 is 4.0 nm. The thicknesses of the first well layers 113*a* other than the first well layer 113*a* located closest to the first p-side semiconductor layer 114 side among the plurality of first well layers 113*a* are 3.4 nm, respectively. The thickness of the first well layer 113*a* located closest to the first p-side semiconductor layer 114 side is 3.8 nm. The thickness of each of the seven third layers 113*b*3 is 3.0 nm.

The thickness of the fourth layer 122*b*4 is 5.1 nm, the thickness of the fifth layer 122*b*5 is 4.0 nm, and the thickness of the sixth layer 122*b*6 is 4.0 nm. The thicknesses of the second well layers 122*a* other than the second well layer 122*a* located closest to the second p-side semiconductor layer 123 side among the plurality of second well layers 122*a* are 3.4 nm, respectively. The thickness of the second well layer 122*a* located closest to the second p-side semiconductor layer 123 side is 3.8 nm.

The structure of the first barrier layer 113*b* and the structure of the second barrier layer 122*b* in the nitride semiconductor light-emitting elements of the fourth to sixth comparative examples are described in detail below.

Fourth Comparative Example

The thickness of the first layer 113*b*1 is 5.1 nm and the thickness of the second layer 113*b*2 is 4.0 nm. The thicknesses of the first well layers 113*a* other than the first well layer 113*a* located closest to the first p-side semiconductor layer 114 side among the plurality of first well layers 113*a* are 3.4 nm, respectively. The thickness of the first well layer 113*a* located closest to the first p-side semiconductor layer 114 side is 3.8 nm. The thickness of each of the seven third layers 113*b*3 is 4.0 nm.

The thickness of the fourth layer 122*b*4 is 5.1 nm and the thickness of the fifth layer 122*b*5 is 4.0 nm. The thicknesses of the second well layers 122*a* other than the second well layer 122*a* located closest to the second p-side semiconductor layer 123 side among the plurality of second well layers 122*a* are 3.4 nm, respectively. The thickness of the second well layer 122*a* located closest to the second p-side semiconductor layer 123 side is 3.8 nm. The thickness of each of the seven sixth layers 122*b*6 is 4.0 nm.

Fifth Comparative Example

The thickness of the first layer 113*b*1 is 5.1 nm and the thickness of the second layer 113*b*2 is 4.0 nm. The thicknesses of the first well layers 113*a* other than the first well layer 113*a* located closest to the first p-side semiconductor layer 114 side among the plurality of first well layers 113*a* are 3.4 nm, respectively. The thickness of the first well layer 113*a* located closest to the first p-side semiconductor layer 114 side is 3.8 nm. The thickness of each of the seven third layers 113*b*3 is 4.0 nm.

The thickness of the fourth layer 122*b*4 is 4.0 nm and the thickness of the fifth layer 122*b*5 is 4.0 nm. The thicknesses of the second well layers 122*a* other than the second well layer 122*a* located closest to the second p-side semiconductor layer 123 side among the plurality of second well layers 122*a* are 3.4 nm, respectively. The thickness of the second well layer 122*a* located closest to the second p-side semiconductor layer 123 side is 3.8 nm. The thickness of each of the seven sixth layers 122*b*6 is 3.5 nm.

Sixth Comparative Example

The thickness of the first layer 113*b*1 is 5.1 nm and the thickness of the second layer 113*b*2 is 4.0 nm. The thicknesses of the first well layers 113*a* other than the first well layer 113*a* located closest to the first p-side semiconductor layer 114 side among the plurality of first well layers 113*a* are 3.4 nm, respectively. The thickness of the first well layer 113*a* located closest to the first p-side semiconductor layer 114 side is 3.8 nm. The thickness of each of the seven third layers 113*b*3 is 4.0 nm.

The thickness of the fourth layer 122*b*4 is 4.0 nm and the thickness of the fifth layer 122*b*5 is 4.0 nm. The thicknesses of the second well layers 122*a* other than the second well layer 122*a* located closest to the second p-side semiconductor layer 123 side among the plurality of second well layers 122*a* are 3.4 nm, respectively. The thickness of the second well layer 122*a* located closest to the second p-side semiconductor layer 123 side is 3.8 nm. The thickness of each of the seven sixth layers 122*b*6 is 3.0 nm.

FIG. 7 illustrates the evaluation results of light emission outputs Po and forward voltages Vf for the nitride semiconductor light-emitting elements of the first and second reference examples and the fourth to sixth comparative examples. Note that the values of the light emission outputs Po and the forward voltages Vf are values obtained when an electric current of 120 mA flows through the nitride semiconductor light-emitting elements.

According to FIG. 7, by making the thickness of the third layer 113*b*3 of the first light-emitting portion 110 less than the thickness of the sixth layer 122*b*6 of the second light-emitting portion 120 as in the nitride semiconductor light-emitting elements of the first and second reference examples, higher light emission output Po was obtained while maintaining the forward voltage Vf approximately equal to the forward voltage Vf of the nitride semiconductor light-emitting elements in the fourth to sixth comparative examples. From the results of the fourth to sixth comparative examples, the inventors of the present application have confirmed that when only the thickness of the sixth layer 122*b*6 of the second light-emitting portion 120 is made less than the thickness of the third layer 113*b*3 of the first light-emitting portion 110, the light emission output Po tends to be reduced.

The embodiments disclosed this time are illustrative in all respects and are not intended to be the basis of limiting interpretation. Accordingly, the technical scope of the present invention is not construed solely by the embodiments described above but is defined based on the description of the scope of claims. In addition, the technical scope of the present invention includes all variations within the meaning and scope equivalent to the scope of claims.

What is claimed is:

1. A nitride semiconductor light-emitting element comprising:
- a first n-side semiconductor layer;
- a first active layer disposed on the first n-side semiconductor layer and comprising first barrier layers and first well layers alternately arranged;
- a first p-side semiconductor layer disposed on the first active layer;
- a second n-side semiconductor layer disposed on and in contact with the first p-side semiconductor layer;
- a second active layer disposed on the second n-side semiconductor layer; and
- a second p-side semiconductor layer disposed on the second active layer; wherein:
- the first barrier layer comprises layers including a first layer located closest to the first n-side semiconductor layer, a second layer located closest to the first p-side semiconductor layer, and a plurality of third layers located between the first layer and the second layer;
- the plurality of third layers comprise a first group comprising one or more of the third layers and a second group comprising one or more of the third layers and located closer to the first p-side semiconductor layer than is the first group; and
- a thickness of each third layer of the second group is less than a thickness of each third layer of the first group.

2. The nitride semiconductor light-emitting element according to claim 1, wherein:
- the number of third layers comprised in the first group is s, where s is a natural number;
- the number of third layers comprised in the second group is t, where t is a natural number; and
- $s<t$ in the plurality of third layers.

3. The nitride semiconductor light-emitting element according to claim 2, wherein:
- the thickness of each third layer of the first group is greater than a thickness of the first well layer; and
- the thickness of each third layer of the second group is less than the thickness of the first well layer.

4. The nitride semiconductor light-emitting element according to claim 3, wherein:
- a thickness of each first well layer is in a range from 2 nm to 5 nm;
- a thickness of each third layer of the first group is in a range from 2 nm to 6 nm; and
- a thickness of each third layer of the second group is in a range from 2 nm to 5 nm.

5. The nitride semiconductor light-emitting element according to claim 2, wherein:
- a thickness of each first well layer is in a range from 2 nm to 5 nm;
- a thickness of each third layer of the first group is in a range from 2 nm to 6 nm; and
- a thickness of each third layer of the second group is in a range from 2 nm to 5 nm.

6. The nitride semiconductor light-emitting element according to claim 1, wherein:
- the second active layer comprises second barrier layers and second well layers alternately arranged;
- the second barrier layer comprises layers including a fourth layer located closest to the second n-side semiconductor layer, a fifth layer located closest to the second p-side semiconductor layer, and a plurality of sixth layers located between the fourth layer and the fifth layer;

the plurality of sixth layers comprise a third group comprising one or more of the sixth layers and a fourth group comprising one or more of the sixth layers and located closer to the second p-side semiconductor layer side than is the third group; and a thickness of each sixth layer of the fourth group is less than a thickness of each sixth layer of the third group.

7. The nitride semiconductor light-emitting element according to claim 6, wherein:

the number of sixth layers comprised in the third group is u, where u is a natural number;

the number of sixth layers comprised in the fourth group is v, where v is a natural number; and $u<v$ in the plurality of sixth layers.

8. The nitride semiconductor light-emitting element according to claim 7, wherein:

the thickness of each sixth layer of the third group is greater than a thickness of the second well layer; and the thickness of each sixth layer of the fourth group is less than the thickness of the second well layer.

9. The nitride semiconductor light-emitting element according to claim 7, wherein:

the number of third layers is the same as the number of sixth layers; and $t>v$ in the second group and the fourth group.

10. The nitride semiconductor light-emitting element according to claim 6, wherein:

the thickness of each sixth layer of the third group is greater than a thickness of the second well layer; and the thickness of each sixth layer of the fourth group is less than the thickness of the second well layer.

11. The nitride semiconductor light-emitting element according to claim 10, wherein:

the number of third layers is the same as the number of sixth layers; and $t>v$ in the second group and the fourth group.

12. The nitride semiconductor light-emitting element according to claim 6, wherein:

a thickness of each second well layer is in a range from 2 nm to 5 nm;

a thickness of each sixth layer of the third group is in a range from 2 nm to 6 nm; and a thickness of each sixth layer of the fourth group is in a range from 2 nm to 5 nm.

13. The nitride semiconductor light-emitting element according to claim 1, wherein:

the second active layer comprises second barrier layers and second well layers alternately arranged;

the second barrier layer comprises layers including a fourth layer located closest to the second n-side semiconductor layer, a fifth layer located closest to the second p-side semiconductor layer, and a plurality of sixth layers located between the fourth layer and the fifth layer;

the plurality of sixth layers comprise a third group comprising one or more of the sixth layers and a fourth group comprising one or more of the sixth layers and located closer to the second p-side semiconductor layer side than is the third group; and a thickness of each sixth layer of the fourth group is less than a thickness of each sixth layer of the third group.

14. The nitride semiconductor light-emitting element according to claim 13, wherein:

the number of sixth layers comprised in the third group is u, where u is a natural number;

the number of sixth layers comprised in the fourth group is v, where v is a natural number, and $u<v$ in the plurality of sixth layers.

15. The nitride semiconductor light-emitting element according to claim 13, wherein:

a thickness of each second well layer is in a range from 2 nm to 5 nm;

a thickness of each sixth layer of the third group is in a range from 2 nm to 6 nm; and a thickness of each sixth layer of the fourth group is in a range from 2 nm to 5 nm.

16. The nitride semiconductor light-emitting element according to claim 1, wherein:

the second active layer comprises second barrier layers and second well layers alternately arranged;

the second barrier layer comprises layers including a fourth layer located closest to the second n-side semiconductor layer, a fifth layer located closest to the second p-side semiconductor layer, and a plurality of sixth layers located between the fourth layer and the fifth layer;

the plurality of sixth layers comprise a third group comprising one or more of the sixth layers and a fourth group comprising one or more of the sixth layers and located closer to the second p-side semiconductor layer side than is the third group; and a thickness of each sixth layer of the fourth group is less than a thickness of each sixth layer of the third group.

17. The nitride semiconductor light-emitting element according to claim 16, wherein:

the number of sixth layers comprised in the third group is u, where u is a natural number;

the number of sixth layers comprised in the fourth group is v, where v is a natural number; and $u<v$ in the plurality of sixth layers.

18. The nitride semiconductor light-emitting element according to claim 16, wherein:

a thickness of each second well layer is in a range from 2 nm to 5 nm;

a thickness of each sixth layer of the third group is in a range from 2 nm to 6 nm; and a thickness of each sixth layer of the fourth group is in a range from 2 nm to 5 nm.

19. The nitride semiconductor light-emitting element according to claim 1, wherein:

a thickness of each first well layer is in a range from 2 nm to 5 nm;

a thickness of each third layer of the first group is in a range from 2 nm to 6 nm; and a thickness of each third layer of the second group is in a range from 2 nm to 5 nm.

* * * * *